United States Patent
Chi

(10) Patent No.: US 6,373,090 B1
(45) Date of Patent: Apr. 16, 2002

(54) SCHEME OF CAPACITOR AND BIT-LINE AT SAME LEVEL AND ITS FABRICATION METHOD FOR 8F2 DRAM CELL WITH MINIMUM BIT-LINE COUPLING NOISE

(75) Inventor: Min-Hwa Chi, Hsinchu (TW)

(73) Assignee: Vanguard International Semiconductor Corporation, Hsin-chu (TW)

(*) Notice: Subject to any disclaimer, the term of this patent is extended or adjusted under 35 U.S.C. 154(b) by 0 days.

(21) Appl. No.: 09/655,026

(22) Filed: Sep. 5, 2000

Related U.S. Application Data

(62) Division of application No. 09/075,370, filed on May 11, 1998, now Pat. No. 6,174,767.

(51) Int. Cl.[7] .................. H01L 27/108; H01L 29/76; H01L 29/94; H01L 31/119; H01L 21/8242
(52) U.S. Cl. ........................... 257/306; 438/253
(58) Field of Search ................. 257/587, 306, 257/295, 382, 763; 438/253

(56) References Cited

U.S. PATENT DOCUMENTS

| | | | |
|---|---|---|---|
| 5,045,899 A | 9/1991 | Arimoto | 357/23.6 |
| 5,107,459 A | 4/1992 | Chu et al. | 365/63 |
| 5,449,934 A | 9/1995 | Sheno et al. | 257/295 |
| 6,150,688 A | * 11/2000 | Maeda | 257/302 |
| 6,168,984 B1 | * 1/2001 | Joo et al. | 438/239 |
| 6,187,624 B1 | * 2/2001 | Huang | 438/253 |
| 6,194,757 B1 | * 2/2001 | Shinkawata | 257/306 |
| 6,255,160 B1 | * 7/2001 | Huang | 438/253 |

OTHER PUBLICATIONS

Y. Kohyama, "A Fully Printable, Self–aligned and Planarized Stacked Capacitor DRAM Cell Technology for IG bit DRAM and Beyond", 1997 Symposium on VLSI Technology Digest of Technical Papers Paper 3A–1 p 17–18.

* cited by examiner

*Primary Examiner*—David Nelms
*Assistant Examiner*—Thao P. Le
(74) *Attorney, Agent, or Firm*—George O. Saile; Stephen B. Ackerman; Graham S. Jones, III

(57) ABSTRACT

A structure with bit lines and capacitors for a semiconductor memory device is formed by the following steps. Form a gate oxide layer on a doped silicon semiconductor substrate. Form gate electrode stacks juxtaposed with conductive plugs over the gate oxide layer, the conductive plugs being separated by a first dielectric material in a direction oriented transversely of the gate electrode stacks. Form a first interpolysilicon layer above the conductive plugs. Form bit-lines in the first interpolysilicon layer above the first dielectric material. Form a capacitor above a plug and between a pair of the bit-lines.

10 Claims, 11 Drawing Sheets

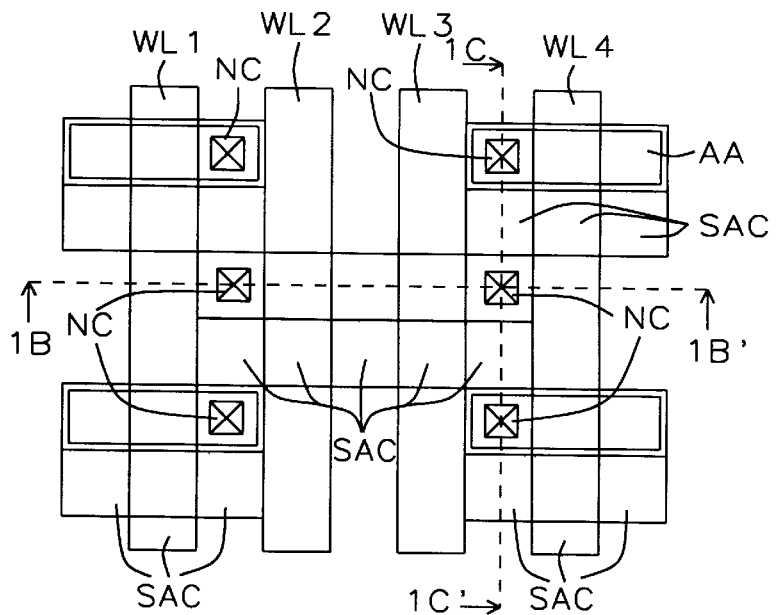
FIG. 1A – Prior Art
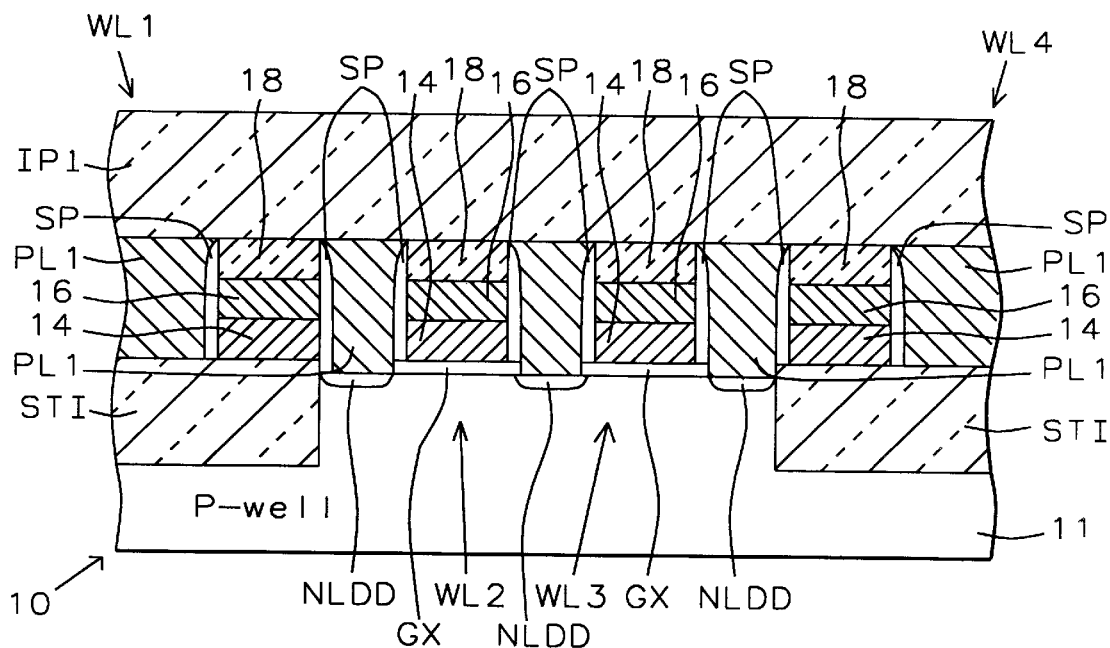
FIG. 1B – Prior Art

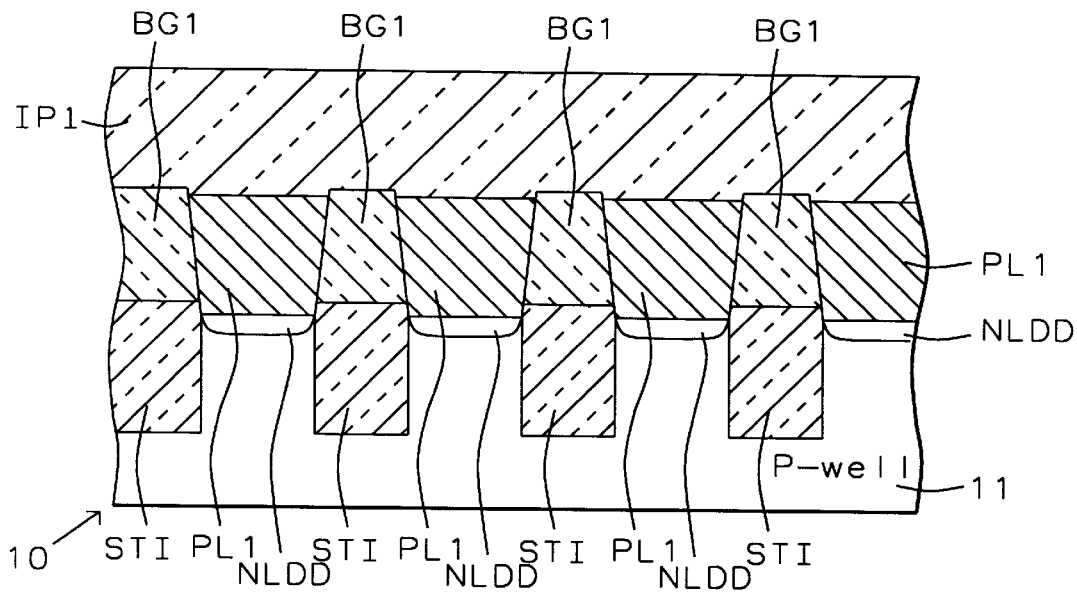
FIG. 1C – Prior Art
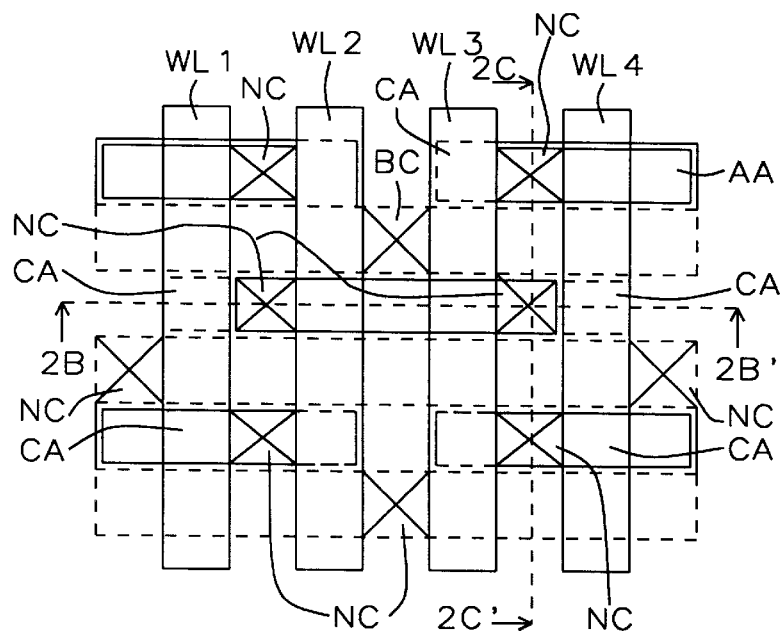
FIG. 2A – Prior Art

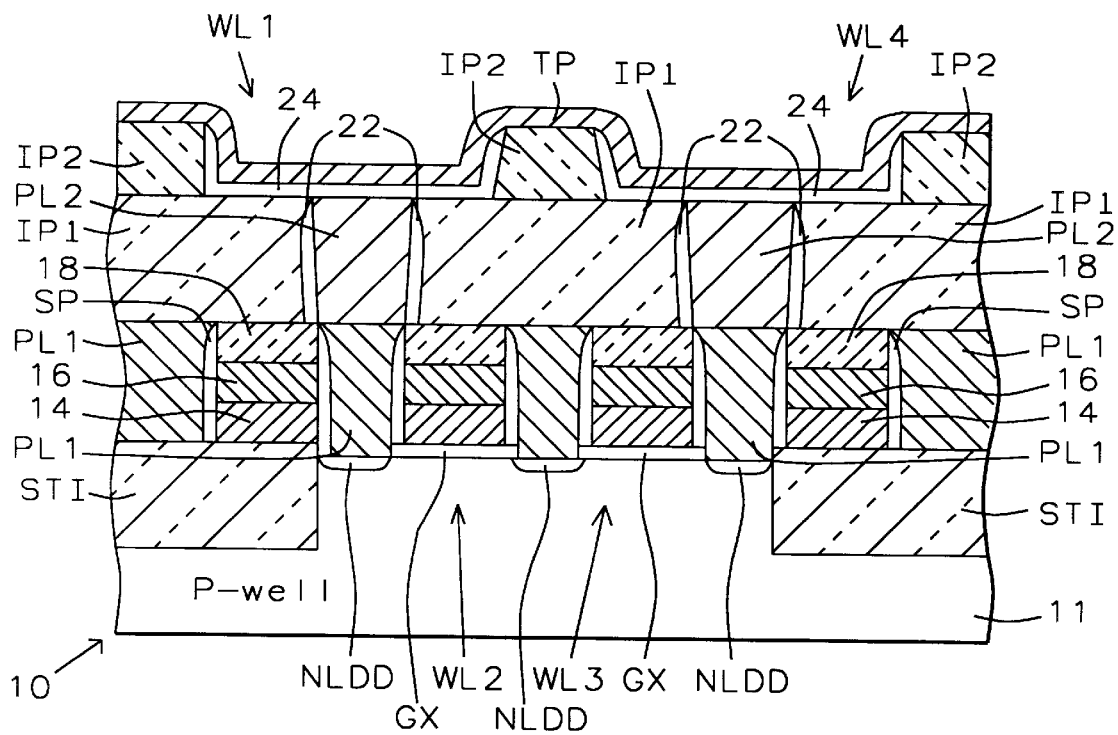
FIG. 2B – Prior Art
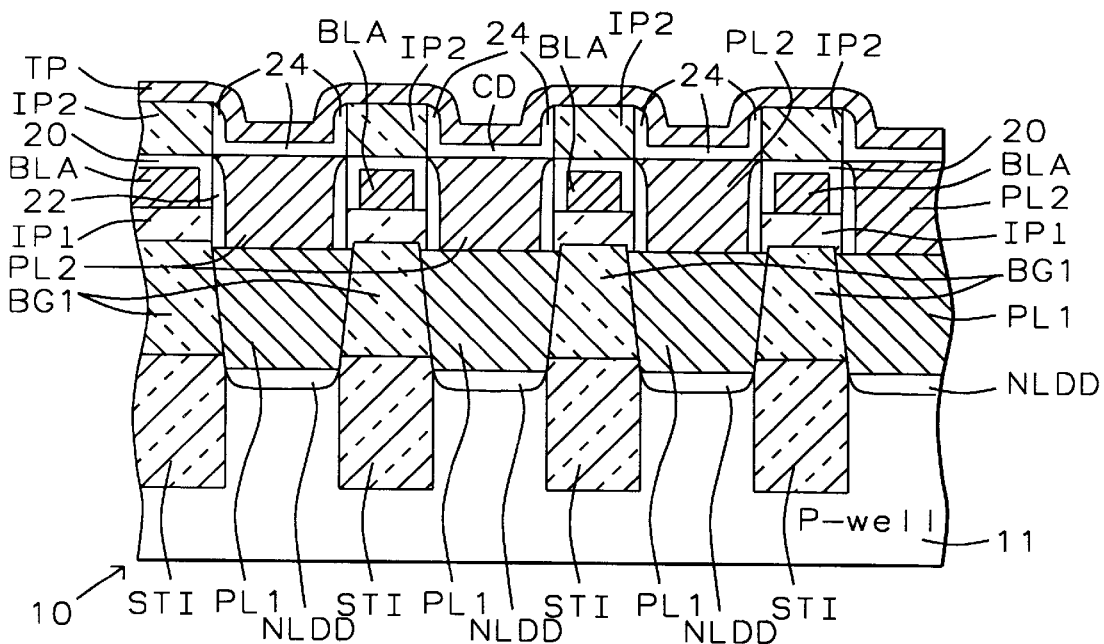
FIG. 2C – Prior Art

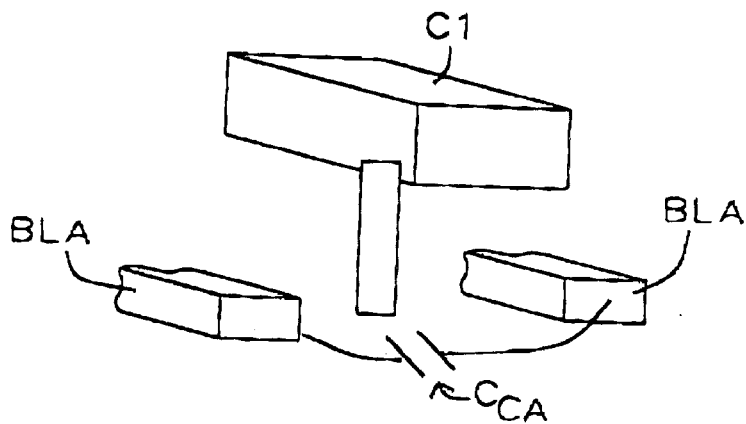
FIG. 3A - Prior Art
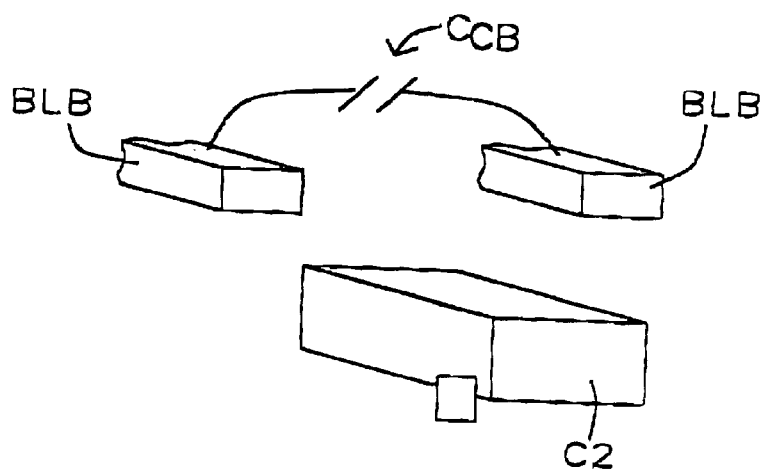
FIG. 3B - Prior Art
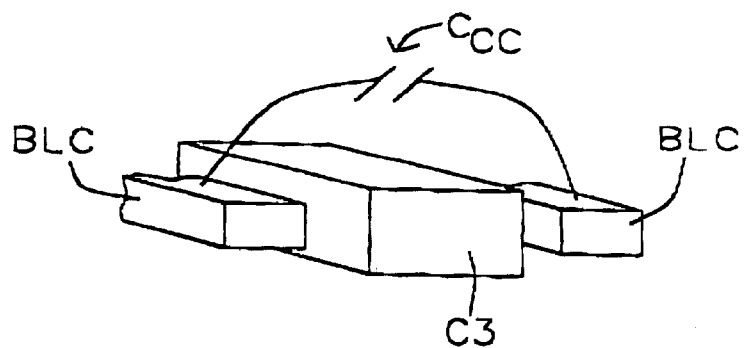
FIG. 3C

SCHEME OF CAPACITOR AND BIT-LINE AT SAME LEVEL AND ITS FABRICATION METHOD FOR 8F2 DRAM CELL WITH MINIMUM BIT-LINE COUPLING NOISE

This is a division of patent application Ser. No. 09/075,370, filing date May 11, 1998 U.S. Pat. No. 6,174,767, A New Scheme Of Capacitor And Bit-Line At Same Level And Its Fabrication Method For 8F2 Dram Cell Withminimum Bit-Line Coupling Noise, assigned to the same assignee as the present invention.

BACKGROUND OF THE INVENTION

1. Field of the Invention

This invention relates to FET semiconductor devices and more particularly to capacitor structures formed on FET semiconductor devices.

2. Description of Related Art

U.S. Pat. No. 5,045,899 of Arimoto for "Dynamic Random Access Memory Having Stacked Capacitor Structure" shows a DRAM in which a plurality of word-lines (WL) and a plurality of bit-lines are arranged to orthogonally intersect each other. Memory cells are arranged in a direction intersecting the bit-lines. Capacitors of the memory cells are arranged between the adjacent bit-lines. On a silicon substrate, the bit-line is formed substantially at the same height with the word-line and positioned lower than the top of the capacitor. The arrangement of the capacitors between the adjacent bit-lines allows reduction in the inter-bit-line capacitance.

U.S. Pat. No. 5,107,459 of Chu et al. for "Stacked Bit-Line Architecture for High Density Cross-Point Memory Cell Array" shows a DRAM semiconductor memory device. The true and complementary bit-line pairs connected to the respective memory cell arrays are formed in two metal layers, one above the other.

U.S. Pat. No. 5,449,934 of Shono et al. for "Semiconductor Memory Device and Process" shows a DRAM memory device with a COB (Capacitor Over Bit-line) structure with a Bitline below Capacitor arrangement. The storage capacitor contact passes through a bit-line, a drain and source can be arranged symmetrically with a word-line, like a memory cell with a bit-line below-storage-capacitor organization cell.

FIGS. 3A and 3B provide a comparison of prior art COB (FIG. 3A), and CUB (FIG. 3B) designs for DRAM cells.

The COB design of FIG. 3A shows the bit-lines BLA below the capacitor C1 with a high degree of coupling capacity $C_{CA}$. The CUB design of FIG. 3B shows the bit-lines BLB above the capacitor C1 with a high degree of coupling capacity $C_{CB}$, roughly equivalent to coupling capacity $C_{CA}$.

The process flow for the COB design for $8F^2$ DRAM cells of Kohyama et al. is described as follows:

$8F^2$ DRAM Cell with COB for 0.18 Micrometer and Beyond

An article by Kohyama et al., "A Fully Printable, Self-aligned and Planarized Stacked Capacitor DRAM Cell Technology for 1Gbit DRAM and Beyond", 1997 Symposium on VLSI Technology Digest of Technical papers Paper 3A-1, pp. 17–18 (1997) describes an 0.18 micrometer DRAM technology and beyond, the cell on folded-bit-line architecture has minimum cell of $8F^2$.

FIGS. 1A–1C show the first part of a prior art process flow of the Kohyama et al. with a plan view and cross-sectional layouts of the process flow, from isolation to self-aligned polysilicon (Poly) plug formation.

For simple patterns, F represents the minimum feature by a unit square of F×F dimensions, where F is the minimum feature size limited by lithography. There are several key techniques must met in order to achieve an $8F^2$ cell. 1. The mask pattern must be simple to get a larger range of focus depth. 2. Self-aligned node contact to the bit-line must be realized. 3. Planarization by CMP (Chemical Mechanical Polishing) is used extensively.

Kohyama et al. suggests a fabrication method for a COB $8F^2$ DRAM cell with all three of the above listed features as shown in FIGS. 1A and 1B.

1. STI Isolation

The first part of the prior art process is described with reference to FIGS. 1A–1C for cell area, with the process starting with the well-known Shallow Trench Isolation (STI) process as shown in silicon oxide regions STI surrounding active regions AA in the silicon semiconductor substrate of device 10 which is a fragment of a semiconductor wafer. The depth of the trenches is approximately 0.2 μm. Illustrations of the process in the periphery area are not shown.

2. Well Formation

Next follows formation of an N-well in the periphery which is not shown and a P-well 11 in the silicon semiconductor substrate of device 10. The process employed uses well known process steps for implantation of phosphorus and boron respectively in a selective process.

3. Transistor Gate Formation

Gate Oxide/Gate Stack (e.g. polysilicon/$WSi_2$/$Si_3N_4$ deposit)

Then a gate oxide layer GX with a thickness of about 60 Å (not to scale in FIG. 1B) is grown on the surface of P-well 11. with gate oxide layer GX grown above isolation regions STI. Then polycide gate stack material layers of a first polysilicon layer 14, tungsten silicide ($WSi_2$) layer 16 and first silicon nitride ($Si_3N_4$) dielectric layer 18 are deposited.

Gate Stack Mask/Etch (Word Lines (WL) and transistors)

Then a set of transistor gate electrode stacks for word lines in an array and transistors in the periphery are defined by masking and etching to form transistor gate electrode stacks (as shown Word Lines WL1, WL2, WL3 and WL4 in FIGS. 1A and 1B and the layers 14, 16 and 18 shown in FIG. 1B). $SiO_2$/$Si_3N_4$ Deposition (Deposit spacer layers)

Next, spacer layers including a blanket layer of silicon oxide spacer layer SP and a blanket second silicon nitride ($Si_3N_4$) spacer layer are deposited.

Peripheral Area N+, P+, S/D Mask/Implant, RTA Anneal

A mask is used to open the peripheral area. Then the second $Si_3N_4$ spacer layer is etched to form spacers SP for the transistors in the periphery area. Please notice that the silicon nitirde ($Si_3N_4$) spacer layer remains on the cell at this stage of the process.

Transistor LDD regions and source/drain regions, etc. (not shown because they are in the periphery area and are well known process steps) are defined and formed by implanting NLDD, N+, PLDD, and P+ regions selectively followed by a RTA (Rapid Thermal Anneal) annealing step for removing defects resulting from implantation steps.

BPSG Deposition, CMP

Next a BPSG glass layer BG1 is deposited followed by a thermal reflow for the BPSG layer BG1. Next follows a CMP (Chemical Mechanical Polishing) step of planarizing the BPSG glass layer BG1 surface. The CMP step will stop on the top of the second nitride (spacer) layer in the cell area.

4. Self-aligned Polysilicon plug formation SAC Mask/Etch (Stop on Silicon Nitride)

Next, plug holes through layer BG1 are prepared for formation of a lower set of self-aligned polysilicon plugs PL1 which are to be formed later. The plug holes are made by using a SAC (Self-Aligned Contact) mask, which is the same as the active area (AA) mask, but shifted one F as shown in FIG. 1A and described by Kohyama et al. (above), and etching the BPSG layer BG1 on those open areas of the SAC mask with a wet etchant. This wet etching step stops at the second $Si_3N_4$ (spacer) layer. Notice that the SAC mask is the same as the AA mask but is shifted by one F, and the entire periphery area is protected.

Cell Silicon Nitride Spacer Etch (Stop on Oxide)

Then, the second $Si_3N_4$ (spacer) layer is etched to form spacers for the cells by stopping on the silicon oxide spacer layer SP. Then the SAC contact mask photoresist is removed and the wafer 10 is cleaned.

NLDD Ion Implant

Next there is a blank NLDD ion implant for the cell node junctions shown as NLDD regions in FIGS. 1B and 1C.

Deposition of Doped Polysilicon and Polysilicon CMP

Then after a wet dip of the silicon oxide, a blanket N-type doped second polysilicon (plug) layer PL1 covering device 10 is deposited filling the plug holes formed in the SAC Mask/Etch above. Then the doped second polysilicon layer is polished by CMP which stops at the first silicon nitride layer 18 to finish formation of plugs PL1. The polysilicon plugs PL1 are now in contact with the silicon 11 beneath them and plugs PL1 serve the function as an extension (electrically) of the silicon substrate at the node contacts and the bit-line contacts.

Deposition of First IPO layer

Next a blanket first Inter-Polysilicon, silicon Oxide (IPO) dielectric layer IP1 is deposited over device 10. As seen in the cross-section in FIG. 1B, layer IP1 covers the plugs PL1, and the first Silicon Nitride ($Si_3N_4$) layer 18. As seen in the cross-section in FIG. 1C, first inter-polysilicon, silicon oxide dielectric IP1 covers the plugs PL1 and the BPSG layer BG1.

FIGS. 2A–2C show the second part of a prior art process flow of Kohyama et al. with a plan view and cross-sectional views of the results including bit-line formation, self-aligned node capacitor formation, and the back-end process.

5. Bit-line (Damascene W) Formation

A set of bit-lines BLA are formed in openings in the first inter-polysilicon, silicon oxide dielectric layer IP1 by a well known damascene W (tungsten) process with $Si_3N_4$ spacer and capping. This initiates the second stage of the process producing results shown in FIGS. 2A–2C.

Bitline Trough Mask/Etch

First, bit-line trough masking and plasma etching of silicon oxide with an end point at the polysilicon is performed to form bit-line openings in dielectric layer IP1 including openings for bit-line contacts to the polysilicon plugs PL1.

Deposit Silicon Nitride and Etch Back

Then a third blank $Si_3N_4$, layer is deposited and etched back to form second spacers SP2 in the sidewalls of the bit-line openings.

Deposit Tungsten, CMP and Tungsten Etchback

Then the bit-lines BLA are formed in the bitline troughs by depositing a layer of tungsten (W) which is then planarized by a CMP process. A tungsten (W) etchback step follows leaving a gap between the surface of the device 10 and the tungsten bit-lines BLA which are recessed slightly below the surface of the first inter-polysilicon, silicon oxide dielectric layer IP1. Bit-lines BLA rest in the bitline troughs upon the surface of the remainder of dielectric layer IP1.

Silicon Nitride Deposition and CMP to Cap Bit Lines

Next a fourth $Si_3N_4$ layer is deposited and planarized by a CMP process providing caps 20 over the bit-lines BLA as seen in FIG. 2C.

6. Cross-point node contact formation

Then, a self-aligned capacitor node is formed by a technique referred to as "cross-point node contact" in Kohyama et al. formed as a node at the cross-point at the cross-point of the Word Line (WL) mask opening line and the $Si_3N_4$ caps 20 over W bit-lines BLA.

Node Contact Mask/Etch Silicon Oxide

First the node contact mask (which is the same as the WL mask with the periphery area protected) is formed and contact node contact openings are formed by plasma etching down into the first inter-polysilicon, silicon oxide dielectric layer IP1. The etching of the node contact openings stops on the first $Si_3N_4$ layer 18 and the polysilicon node, i.e. plug PL1 and the $Si_3N_4$ caps 20.

Form Silicon Nitride Liner (Deposition and Etchback)

Next $Si_3N_4$ liners 22 are formed by deposition of a $Si_3N_4$ layer which is etched-back leaving liners on the walls of the node contact openings.

Deposit Doped Polysilicon Followed by CMP (CMP of Poly)

Then the node is filled with polysilicon doped with phosphorus formed into storage plugs PL2 by the pattern of the node contact openings. Then the top surfaces of storage plugs PL2 are planarized by a CMP process stopped on $Si_3N_4$ caps 20. The plugs PL2 are in contact polysilicon plug PL1 and the substrate 11 now.

Deposit Second IPO Layer

A second inter-polysilicon, silicon oxide dielectric (IPO) layer IP2 is formed covering device 10. Silicon oxide layer IP2 covers polysilicon storage plugs PL2, first inter-polysilicon, silicon oxide dielectric (IPO) layer IP1 and silicon nitride caps 20.

7. Concave capacitor formation

Storage Cavity Mask/Etch (Stop on $Si_3N_4$)

Then a capacitor cavity is defined by a mask followed by etching silicon oxide inter-polysilicon, silicon oxide dielectric IP2 stopping on the $Si_3N_4$. layer (caps 20) and exposing the surface of the storage plugs PL2.

Deposit Lower Capacitor Electrode Plate Layer and CMP (e.g. Ru, or polysilicon)

Then, referring to FIGS. 2B and 2C, above the storage plugs PL2, very thin lower capacitor electrode plates are formed in electrical and mechanical contact with the upper surfaces of storage plugs PL2. The lower electrode plates are composed of a conductor, e.g. a doped polysilicon conductor for a $Ta_2O_5$ dielectric or a Ru (Ruthenium) conductor for a BST (Barium Strontium Titanate) dielectric respectively for the capacitor. The lower conductor materials are deposited and planarized by CMP.

Deposit Dielectric and Plate (e.g. BST/Ru, or $Ta_2O_5$/TiN/Poly)

Next, the capacitor dielectric material layer 24 (e.g. $Ta_2O_5$ or BST) is deposited over the lower capacitor electrode plates (above plugs PL2).

Top Plate Mask/Etching

The top capacitor plate material (e.g.Ru or TiN/doped polysilicon for BST or $Ta_2O_5$ respectively) is then deposited and patterned by a mask to form the top plate TP. Thus the capacitors are formed above the upper plugs PL2 and above the top surfaces of the bit-lines BLA.

8. Back-end: ILD, CMP, Periphery Contacts C3, M2, Via, M3, Fuse, Passivation, Polyimide The fabrication is completed by conventional back-end process steps (e.g. contact, M2, IMD, Via, M3, fusing, passivation, polyimide). Note that the bit-line is considered to be metal 1 (M1).

There is a similar process flow for $8F^2$ CUB DRAM cell in the Capacitor Under Bit-line (CUB) is also considered to be possible from the flow in Kohyama et al. by modifying the process sequence. The capacitor material can also be either $Ta_2O_5$ or BST. Notice that the capacitor capacitance values are limited by area constraints. Thus the foot prints are the same for either COB or CUB designs, i.e. $3F^2$ in FIG. 2A since the capacitor cannot be extended above or below the bit-line area but can be extended over the word-line due to the minimum feature size F.

Problems which require improvement are as follows:
1. The above-described process flow requires high aspect ratio contacts in the periphery area. The COB design requires contact in the periphery area with a high aspect ratio. The CUB design requires bit-line contact with a high aspect ratio.
2. The bit-line to bit-line coupling is a serious problem.
3. The COB or CUB design cannot increase the footprint of the capacitor since under $8F^2$ cell layout, the capacitor can be extended only over the word-line area (i.e. in the X-direction in FIGS. 2A–2C) but not in the bit-line area and the footprint is $3F^2$.

SUMMARY OF THE INVENTION

The invention shows a CEB design - capacitor on the same level as the bit-line.

In accordance one aspect of this invention, a device with bit lines and a capacitor for a semiconductor memory device includes a gate oxide layer on a doped silicon semiconductor substrate. Gate electrode/word-line stacks are juxtaposed with doped polysilicon plugs over the gate oxide layer. The doped polysilicon plugs are separated by a first dielectric material in a direction transverse to the gate electrode/word-line stacks. A first interpolysilicon layer overlies the doped polysilicon plugs. There are bit-lines in the first interpolysilicon layer above the first dielectric material and capacitors above the plugs, between bit-lines.

Preferably, the capacitor comprises a thin conductive layer of doped polysilicon on the surface of the polysilicon plugs having been polished by CMP, a capacitor dielectric layer composed of $Ta_2O_5$/TiN above the thin conductive layer, and an upper plate of the capacitor composed of doped polysilicon above the capacitor dielectric layer.

Preferably, a dielectric layer overlies the bit-lines of a silicon nitride layer to seal the bit-lines. A second interpolysilicon layer is formed above the bit-lines. The second interpolysilicon layer has been planarized by chemical mechanical polishing.

Preferably, the gate electrode stacks comprise gate electrode/word-line stacks and the gate electrode stacks comprise doped polysilicon plugs.

BRIEF DESCRIPTION OF THE DRAWINGS

The foregoing and other aspects and advantages of this invention are explained and described below with reference to the accompanying drawings, in which:

FIGS. 1A–1C show the first part of a prior art process flow with a plan view and cross-sectional layouts of the process flow, from isolation to self-aligned polysilicon plug formation.

FIGS. 2A–2C show the second part of a prior art process flow with a plan view and cross-sectional views of the results including bit-line formation, self-aligned node capacitor formation, and the back-end process.

FIGS. 3A, 3B and 3C provide a comparison of comparison of COB (FIG. 3A), CUB (FIG. 3B), and new CEB (FIG. 3C) designs in accordance with this invention for $8F^2$ DRAM cells.

DESCRIPTION OF THE PREFERRED EMBODIMENT

Figure 4A:
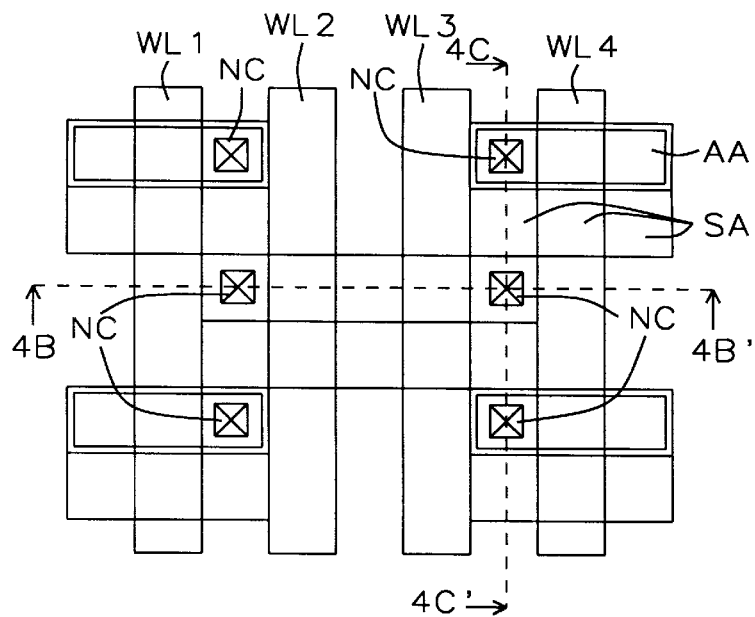
FIGS. 4A–4C show the first part of the CEB (Capacitor Equal Bit-line) process flow with a plan view and cross-sectional layouts of the process flow, from isolation to self-aligned polysilicon plug formation in accordance with this invention.

This invention provides a new capacitor and bit-line design at the same level and its fabrication method for an $8F^2$ DRAM Cell with minimum bit-line coupling noise.

FIGS. 3A, 3B and 3C are grouped to provide a comparison of COB (FIG. 3A), CUB (FIG. 3B), and new CEB (FIG. 3C) design in accordance with this invention for $8F^2$ DRAM cells.

As pointed out above, the COB design of FIG. 3A shows the bit-lines BLA below the capacitor C1 with a high degree of coupling capacity $C_{CA}$. The CUB design of FIG. 3B shows the bit-lines BLB above the capacitor C1 with a high degree of coupling capacity $C_{CB}$, roughly equivalent to coupling capacity $C_{CA}$.

The new CEB design of FIG. 3C shows the bit-lines BLC on either side of the capacitor C3 with a low degree of coupling capacity $C_{CA}$. This results in a far lower inter-bit-line coupling capacity $C_{CC}$, a lower aspect ratio of contacts, and less topology. For an $8F^2$ cell, the capacitor foot print area is $3F^2$, the same among all designs, since capacitors can not be extended over or under a bit-line area.

The new $8F^2$ DRAM cell design of FIG. 3C and its fabrication method can result in minimum bit-line coupling by fabricating the bit-line and storage capacitor at the same level, referred to as capacitor equal bit-line (CEB level for convenience), so that the bit-lines BLC are isolated and shielded by the capacitor C3 and top plate. Only a small section of the bit-lines BLC are coupled with each other. In this way, a minimum amount of capacitance coupling $C_{CC}$ can be achieved between bit-lines BLC as compared with conventional design of Capacitor Over Bit-line (COB) or Capacitor Under Bit-line (CUB) in DRAM cell design. The new fabrication method and structure result in less topology, a lower aspect ratio of the contacts, and one less mask (than the COB or CUB designs) since the node and bit-line contacts are defined simultaneously. The new CEB design and process flow is promising for future $8F^2$ cells in 0.18 micrometer DRAM devices and beyond.

Details of the CEB design of this invention are described below.
(a) CEB Design:

The idea of CEB (as illustrated in FIG. 3C) is simply the fabrication of bit-lines BLC and storage capacitor C3 at the same topology level, (thus referred to as Capacitor Equal Bit-line (CEB) level for convenience).

There are several advantages of this design, as follows:
1. Isolation of Bit-lines The bit-lines BLC are blocked (or isolated) by capacitor walls for about 75% of the length of bit-lines BLC. Only a small section (25%) of bit-lines BLC are facing each other with silicon oxide in-between. The top plate of capacitors C3 in FIG. 3C serves as a shielding between bit-lines BLC. In this way, a minimum capacitance coupling between bit-lines can be achieved compared with conventional capacitor over bit-line (COB) design or capacitor under bit-line design (CUB) in DRAM cell design. The CUB design results in the entire length of the bit-lines BLA facing each other without any shielding by the top plates of capacitors. The COB design also leads to large parts of the bit-lines BLB facing each other except blocked by polysilicon plug of capacitor node and also has no shielding by the top plates.

2. Aspect Ratios

Second, the CEB design results in smaller aspect ratios of both node and bit-line contacts than either COB or CUB design, simply due to capacitors and bit-lines being at the same topography level.

3. Simpler Process

The process is also simpler than COB or CUB designs as as seen by a comparison between the method of FIGS. 1A–1C and FIGS. 2A–2C with the method of FIGS. 4A–4C and FIGS. 5A–5C.

Fabrication Method

Figure 4B:
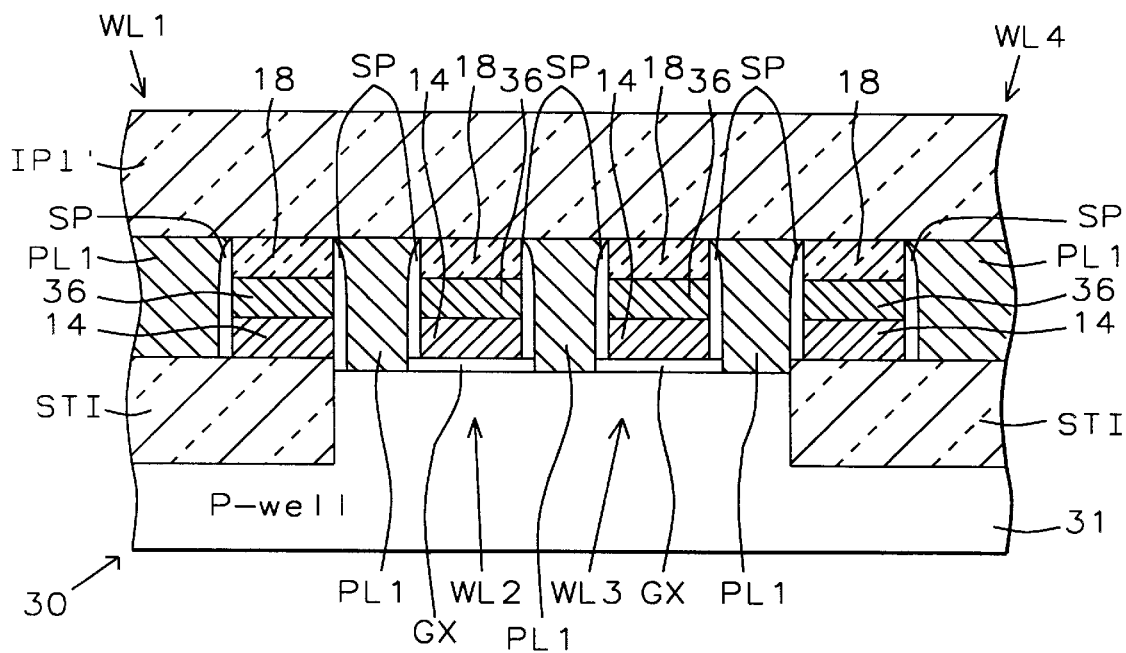
Figure 4C:
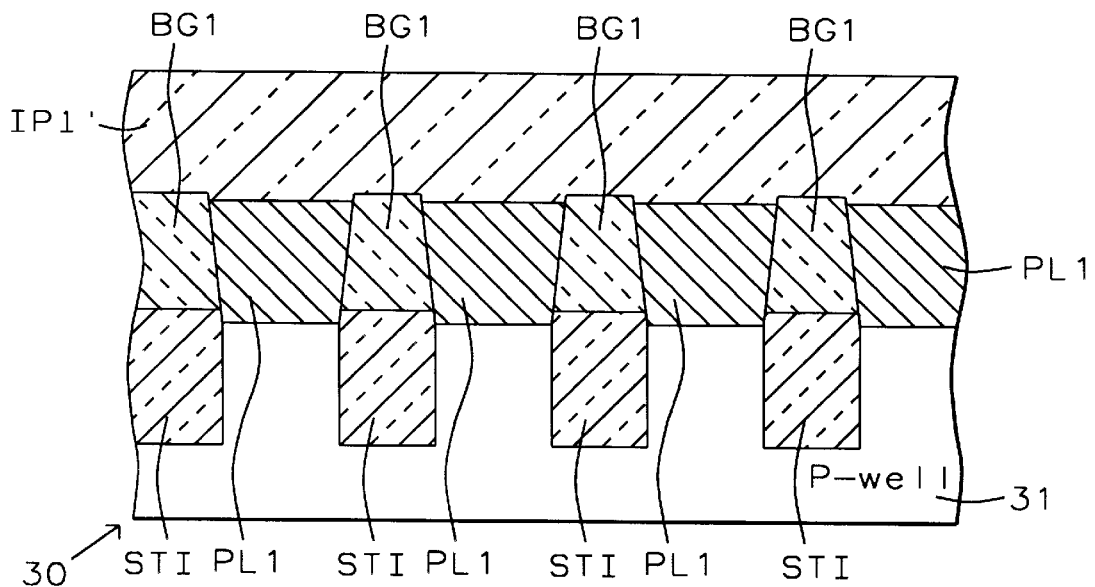

A process flow for the new CEB design on 8F² cell layout is summarized in FIGS. 4A–4C and FIGS. 5A–5C. This flow is based on many process features as described in the prior art (FIGS. 1A–1C and 2A–2C) except that the node and bit-line contacts are opened at the same time for the CEB design of FIGS. 4A–4C and FIGS. 5A–5C. As shown in FIG. 4A, the first part of process can be the same as prior art in FIGS. 1A–1C. FIGS. 4A–4C show the first part of the CEB (Capacitor Equal Bit-line) process flow with a plan view and cross-sectional layouts of the process flow, from isolation to self-aligned polysilicon plug formation in accordance with this invention.

The process is very similar or can be identical to the process of FIGS. 1A–1C. In general, the CEB design has the same process flow for isolation, well formation, transistor formation, and polysilicon plug formation as in FIGS. 1A–1C.

1. STI Isolation (1 Mask)

Figure 6A:
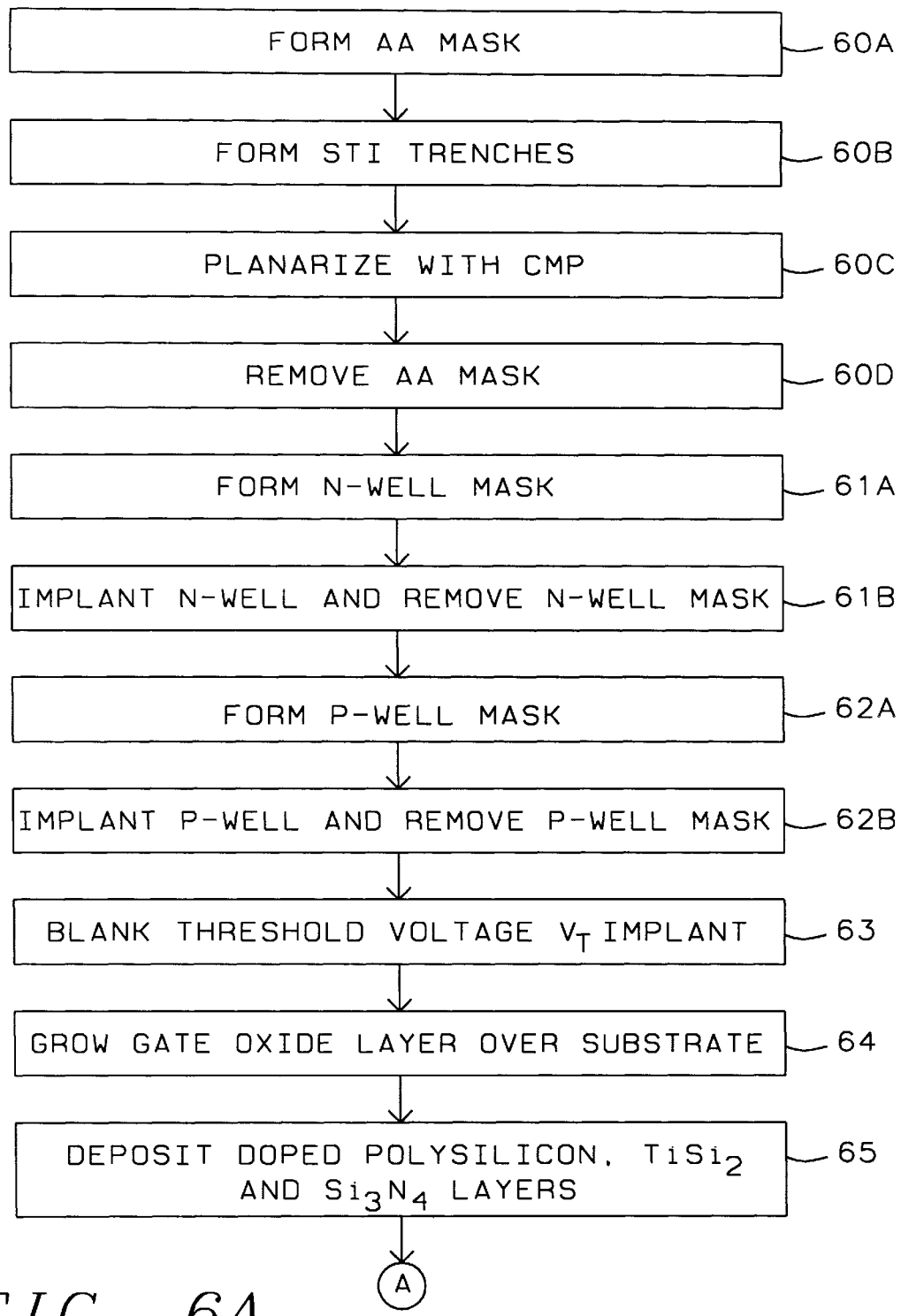
FIGS. 6A–6D show the invention process flow chart.

With reference to FIGS. 4A–4C, the process starts with forming a mask for masking the active area AA in FIG. 4A and as shown in step 60A in the flow chart shown in FIG. 6A etching the silicon substrate to a thickness of about 0.2μm deep. After removing photoresist, and cleaning, a silicon oxide layer is deposited and then planarized by a CMP process.

Then in step 60B shallow silicon trenches are then filled with silicon oxide.

Next, in step 60C, the device is planarized. This well known Shallow Trench Isolation (STI) process results in silicon oxide regions STI formed in a silicon semiconductor substrate 31 of device 30.

In step 60D, the AA mask is removed.

2. Well Formation (2 Masks) Next

Next follows formation of P-well 31 and N-well (not shown) in the silicon semiconductor substrate of device 30, as described in steps 61A, 61B, 62A, and 62B in FIG. 6A.

N-well Formation

An N-well mask is defined in step 61A in FIG. 6A.

Then in step 61B, doping by ion implantation to form the N-well is performed by ion implantation is performed; and then the N-well mask is stripped from the device, after implantation.

P-well Formation

An P-well mask is defined in step 62A in FIG. 6A.

Then in step 62B, ion implantation to form the P-well 31 defined by the P-well mask is performed in P-well 31; and then the P-well mask is stripped from the device, after implantation.

Blank $V_t$ implant.

In step 63 in FIG. 6A, a blank threshold $V_t$ implant is performed in P-well 31 and the N-well to adjust the threshold voltage $V_t$ of the transistors formed in the device 30.

3. Transistor gate formation (4 Masks) Form Gate-Oxide Layer

Then a gate oxide layer GX with a thickness of about 60 Å for 0.18μm DRAM technology is grown on the surface of active area AA, referring to FIG. 4B and step 64 in FIG. 6A.

Form Gate Electrode Stacks (e.g. Polysilicon/TiSi$_2$/Si$_3$N$_4$ deposit)

Then a series of layers comprising polycide gate stack material (e.g. polysilicon/TiSi$_2$/Si$_3$N$_4$) are deposited, sequentially. The gate stack material layers comprise a first polysilicon layer 14, then a titanium silicide (TiSi$_2$) layer 16 and finally a stack cap dielectric layer 18 composed of first silicon nitride (Si$_3$N$_4$), as described in step 65 in FIG. 6A. In the preferred method of this invention a titanium silicide (TiSi$_2$) layer 36 is used instead of the tungsten silicide (WSi) of the prior art Kohyama et al. process described above.

Gate stack masking/etching. (Word-line/peripheral area)

Figure 6B:
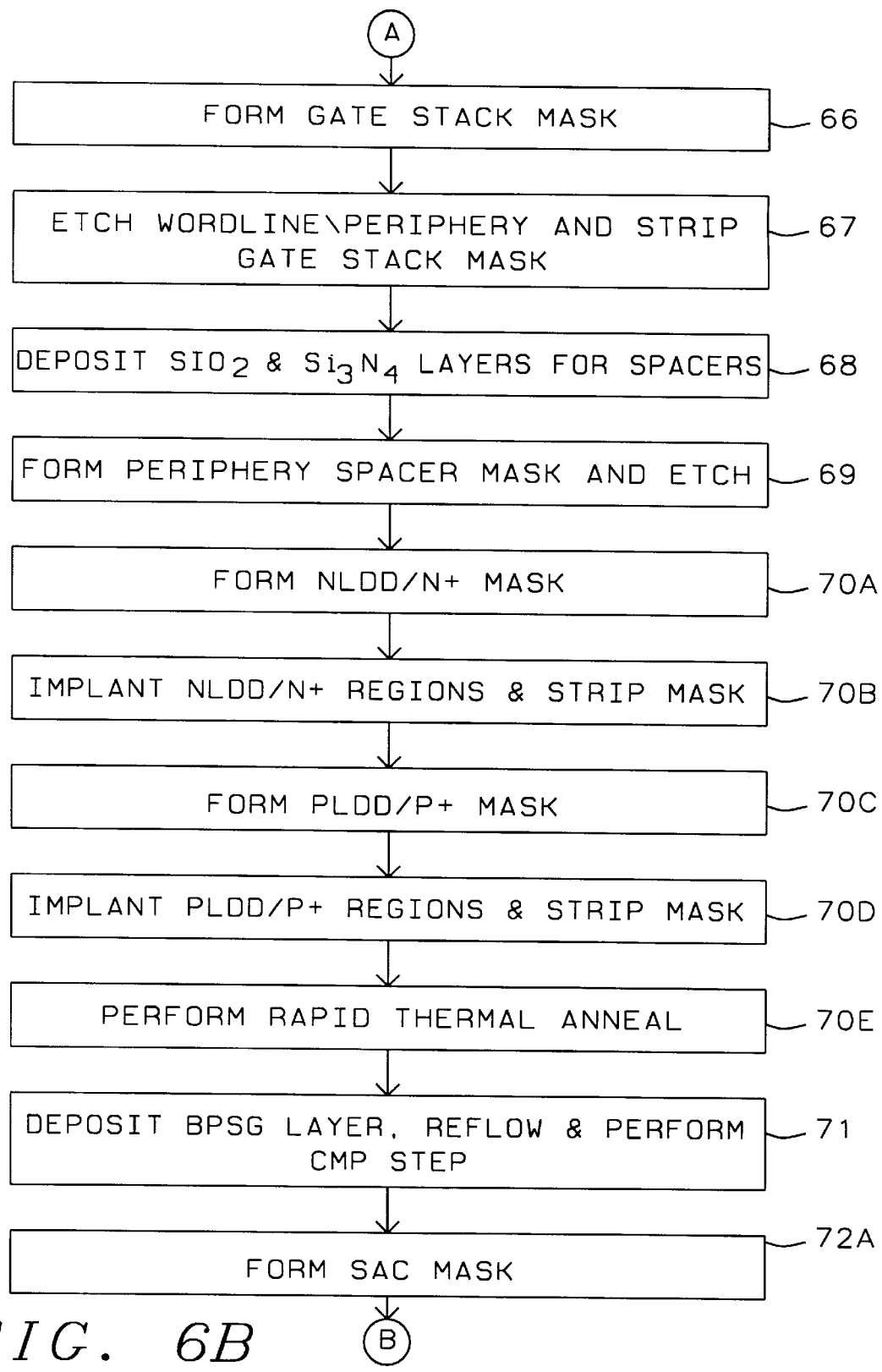

The transistor gate cells are defined by conventional gate stack mask, as described in step 66 in FIG. 6B Next follows a step of etching to form gate electrode stacks for Word-Lines WLI–WL4 and transistors in the periphery area (not shown) comprising gate electrode lower layers 14, gate electrode silicide layers 36 and dielectric layers 18, as described in step 67 in FIG. 6B.

Silicon Oxide/Si$_3$N$_4$ Deposit (for spacer) Spacer layers of silicon dioxide (SiO$_2$) SP and silicon nitride (Si$_3$N$_4$) are deposited to form spacers SP, as described in step 68 in FIG. 6B.

Peripheral Area Spacer Masking/Etching

A peripheral area spacer mask is formed and used to open the peripheral area and for etching back to form spacers SP (from the spacer layers) on the sidewalls of the gate electrode stacks WL1–WL4, as described in step 69 in FIG. 6B.

Peripheral Area NLDD/N+, PLDD/P+Masking/Implant, RTA

As described in step 70A in FIG. 6B, transistors are formed by a series of steps including forming an NLDD/N+ mask which is formed over the device 30. Next, in step 70B ion implant NLDD, N+ regions in the substrate 31. In step 70C, a PLDD/P+ mask is formed over the device 30. Next, in step 70D ion implant PLDD, P+ regions in the substrate 31. Then in step 70E follows annealing of device 30 with an RTA step for removing any defects created during ion implantation.

BPSG Deposit/Reflow/CMP

A blanket BPSG layer BG1 is deposited and reflowed followed by a step of CMP planarization, as described in step 71 in FIG. 6B.

4. Cell (1 mask

SAC Masking/Etching BPSG (stop on silicon nitride)

Then, as described in step 72A in FIG. 6B, a SAC mask (shown in FIG. 4A).

Figure 6C:
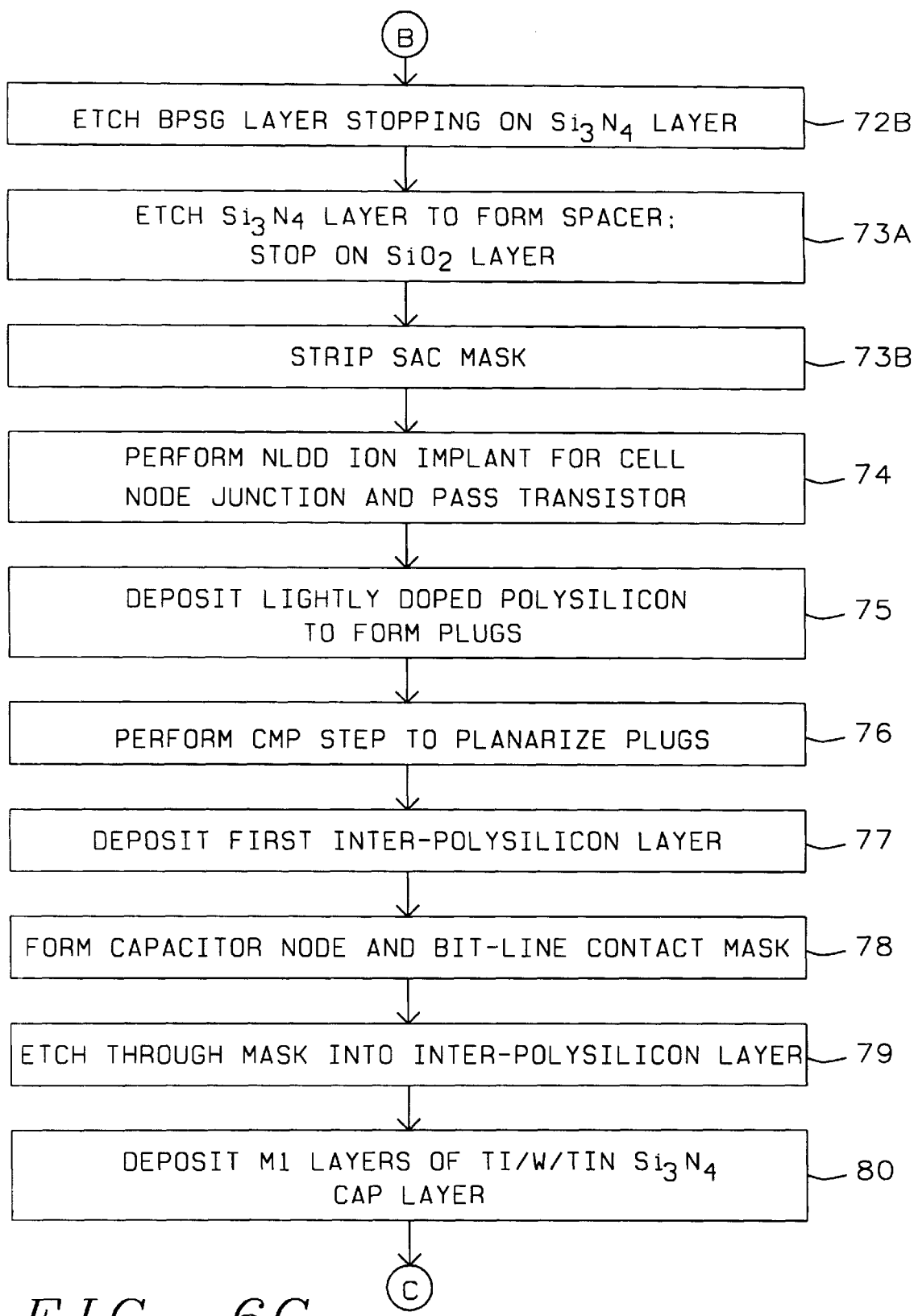

Then, as described in step 72B in FIG. 6C using the SAC mask (shown in FIG. 4A), openings in the blanket BPSG layer BG1 are formed to prepare for the following steps in forming the self-aligned polysilicon-plugs PL1 by using a SAC mask (shown in FIG. 4A). The SAC mask is the same as the AA mask in the cell array area but shifted by 1F, and the entire periphery area is protected. The BPSG etching step stops on the $Si_3N_4$ layer, as described in step 72B in FIG. 6C.

Cell $Si_3N_4$ Spacer Etching (Stop on the oxide layer)

Without stripping the SAC mask, in step 73A in FIG. 6C, there is an etching step which patterns the remaining silicon nitride ($Si_3N_4$) surrounding the gate electrode stacks to form spacers SP on sidewalls of the pass transistors (word lines). The etching stops on the silicon oxide layer. Then in step 73B, the SAC mask is stripped from device 30.

NLDD Implant

Then in step 74, a blank NLDD ion implant is made to form the cell node junctions and pass transistors, as described in step 74 in FIG. 6C.

Light Polysilicon Deposit Polysilicon & CMP (plug formation)

As described in step 75 in FIG. 6C, a deposit is made of a light N-type doped polysilicon layer, forming the plugs PL1 which fill the cavities opened in steps 72A and 72B within the spacers formed in step 73.

Then, as described in step 76 in FIG. 6C that polysilicon layer is polished by CMP for formation of plugs PL1. The CMP step is performed to planarize the plugs PL1.

Deposit First Inter-Polysilicon, Silicon Oxide Dielectric Layer IP1'

A first interlayer, i.e. an inter-polysilicon, silicon oxide-dielectric layer, IP1' is formed on the surface of the device 30 covering the plugs PL1, the caps 18 and the BPSG glass layer BG1, as described in step 77 in FIG. 6C. The cross-sections are shown on FIGS. 4B and 4C.

Figure 5A:
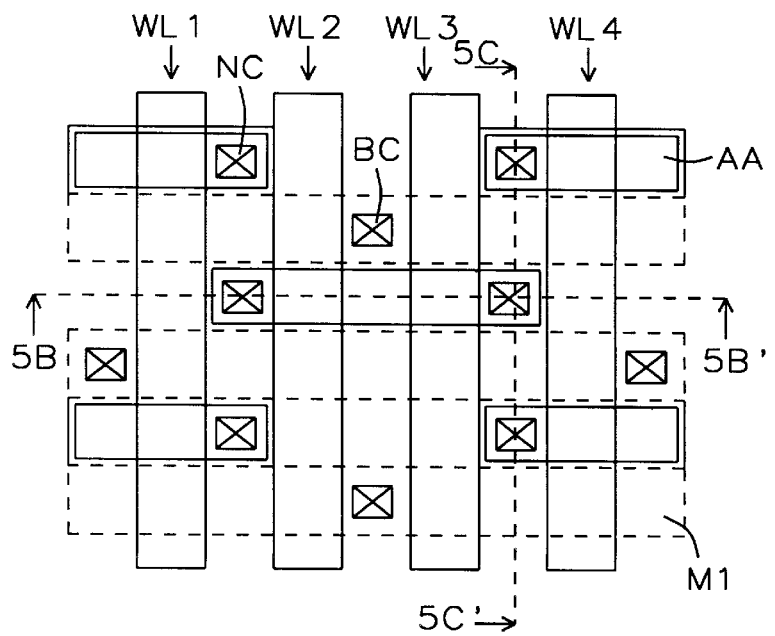
FIGS. 5A–5C show the second part of the CEB (Capacitor Equal Bit-line) process with a plan view and cross-sectional views of the results including bit-line formation, self-aligned node capacitor formation, and the back-end process in accordance with this invention.
Figure 5B:
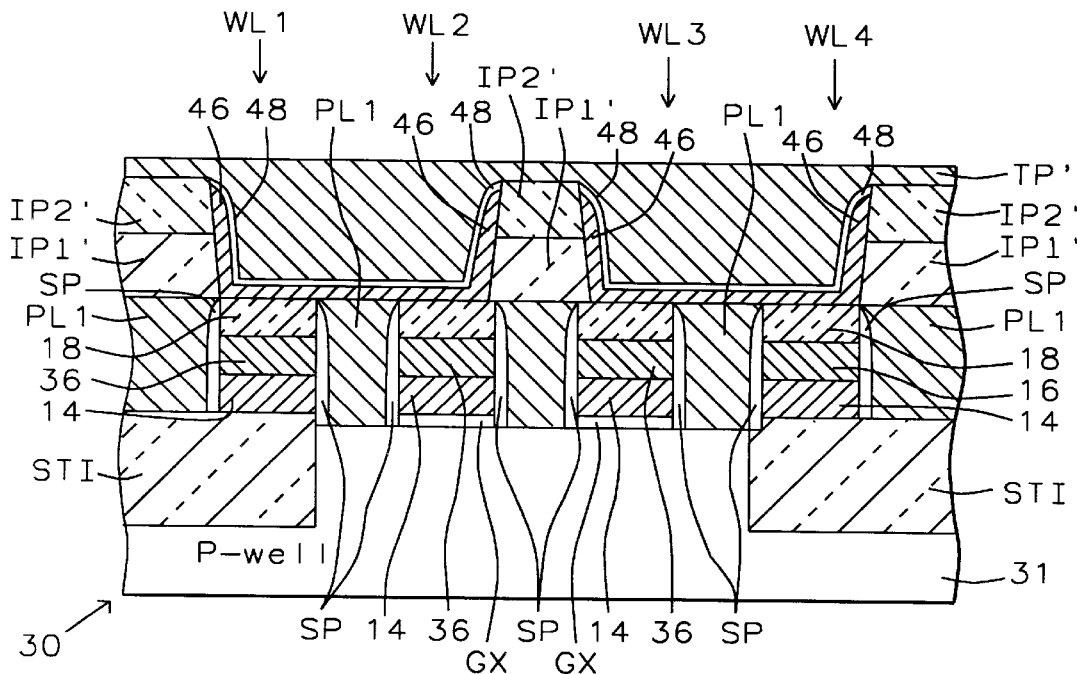
Figure 5C:
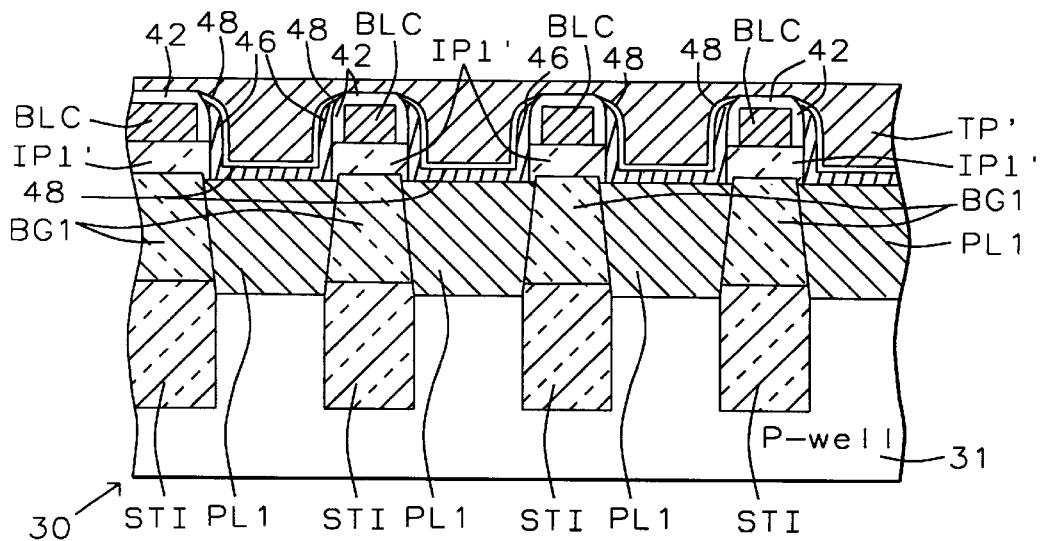

FIGS. 5A–5C show the second part of the CEB (Capacitor Equal Bit-line) process with a plan view and cross-sectional views of the results of the process in accordance with this invention. The results are shown after the second part of the process flow, layout and cross-section of new CEB process flow from bit-line and capacitor formation and back-end process. The second part of the process is simpler than the prior art process of FIGS. 2A–2C as can be seen by from the description which follows.

5. Self-Aligned Bit-Line and Capacitor Formation (3 masks)

Node and Bit-Line Contact Masking/Etching

The capacitor node and bit-line contact mask is formed as described in step 78 in FIG. 6C over the first inter-polysilicon, silicon oxide dielectric layer IP1'.

Next etch silicon oxide layer IP1' is etched through the capacitor node and bit-line contact mask, as described in step 79 in FIG. 6C.

M1 (TiN/W/TiN/Deposit Silicon Nitride), Bit-Line Masking/Etching

Then, metal-1 layers (i.e. TiN/W/TiN/$Si_3N_4$) are deposited, where the $Si_3N_4$ will be used as capping dielectric, as described in step 80 in FIG. 6C.

Figure 6D:
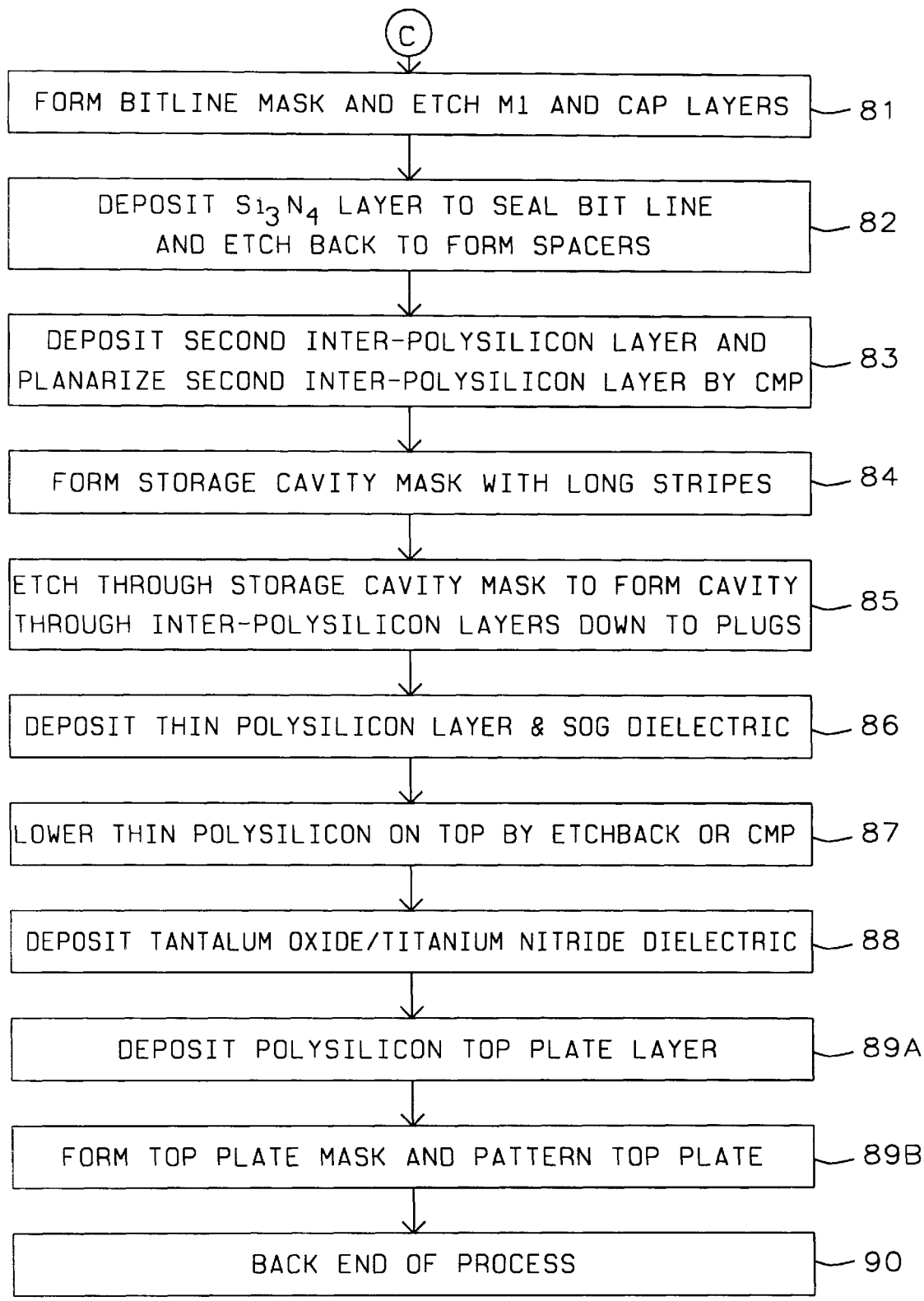

A bit-line mask is then used for defining the bit-lines BLC, as described in step 81 in FIG. 6D.

Silicon Nitride Deposition/Etching Back (Seal W bit-line)

Silicon Nitride $Si_3N_4$ is deposited to seal the bit-lines BLC and is etched-back to form spacer layer 42 on the side walls and tops of bit-lines BLC, as described in step 82 in FIG. 6D. As a result, the bit-lines BLC are completely sealed by $Si_3N_4$ spacer layer 42.

Then, as described in step 83 in FIG. 6D as shown in FIGS. 5B and 5C, a layer of silicon oxide IP2' (second inter-polysilicon, silicon oxide dielectric) has been deposited and planarized by CMP.

Form Storage Cavity Masking/Etching with Long Stripes

Then, as described in step 85 in FIG. 6D, a self-aligned capacitor cavity is opened by a mask with long stripes and etching the silicon oxide layers IP2' and IP1' stopping on $Si_3N_4$. The node polysilicon plug PL1 is now exposed.

Polysilicon Deposit, SOG/Etching Back

Then, as described in step 86 in FIG. 6D, and as shown in FIGS. 5B and 5C, a thin layer of N-type doped polysilicon layer 46 from about 100 Å to about 300 Å thick is deposited in the cavity. In this way, the lower plate (electrode) capacitor is connected to the polysilicon plugs PL1.

Next, in step 87 in FIG. 6D, surplus portions of doped polysilicon layer 46 are planarized by a CMP step stopped on silicon oxide. Now, the thin polysilicon layer 46 is confined inside the storage cavity as the bottom electrode.

Alternatively a process of deposition of a SOG (Spin on Glass) layer is followed by etchback of the SOG layer and the thin polysilicon layer 46, then to remove excess glass from the inside of capacitor cavity. Thus, the thin polysilicon layer 46 is confined inside the capacitor cavity as the bottom electrode of the capacitor.

$Ta_2O_5$/TiN deposit.

As described in step 88 in FIG. 6D and as shown in FIGS. 5B and 5C, capacitor dielectric layers 48 (e.g. tantalum oxide/titanium nitride: $Ta_2O_5$/TiN) are deposited from about 30 Å to about 150 Å thick, with TiN layer used as a conducting electrode and seals the tantalum oxide layer ($Ta_2O_5$.)

Polysilicon deposit, Top plate Mask/etching.

Then, as described in step 89A in FIG. 6D, and as shown in FIGS. 5B and 5C a top plate, N-type doped polysilicon layer TP' is deposited. The top plate layer TP' serves as the capacitor on top of the device 30, separated from the lower plate layer 46 by capacitor dielectric layer 48.

Then, as described in step 89B in FIG. 6D, a plate masking and etching step follows to define the top plate connections.

6. Back End

A conventional back end of the line DRAM process with six masks follows as will be well understood by those skilled in the art as follows:

ILD/CMP; Periphery Contact, M2, Via, M3, Fuse, Passivation, Polyimide.

The fabrication is completed by a conventional back-end process steps (e.g. contacts, M2 metallization, IMD, Via, M3, fusing, passivation). This is as described in step 90 in FIG. 6D.

The new process flow for CEB design has several advantages than prior art in fabrication. The topology is reduced from prior art of COB or CUB design. There is one less mask in the new CEB design, since node and bit-line are defined at the same time. The aspect ratio of node or bit- line contact is also reduced to less than that of the prior art. The new process flow is promising for future $8F^2$ cell in 0.18 micrometer DRAM and beyond and reduced bit-line coupling.

Notice that the bit-line contact and bit-lines also serve the purpose of the first layer of M1 for circuits in the periphery area. Thus, the periphery area contact masking and etching steps can be eliminated. This can also be implemented to improve the prior art process flow. In this case, step 78 in FIG. 6C will include the periphery contacts. Another alternative process of bit-line formation is to use the "Damascene" process. The step 78 in FIG. 6C becomes the formation of bit-line troughs (and node contact and periphery contacts) mask. Then continue to steps 79 and 80 in which case step 79 becomes the polishing of the M1 layers, and eliminates the bit-line masks.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A device with bit lines and a capacitor for a semiconductor memory device comprising:
    a gate oxide layer on a doped silicon semiconductor substrate,
    gate electrode stacks juxtaposed with conductive plugs over said gate oxide layer, said conductive plugs being separated by a first dielectric material in a direction transverse to said gate electrode stacks,
    a first interpolysilicon layer formed above said conductive plugs,
    bit-lines in said first interpolysilicon layer above said first dielectric material, and
    a capacitor above a said plug and between a pair of said bit-lines.

2. A device in accordance with claim 1 wherein said capacitor comprises:
    a thin conductive layer, on the surface of said plugs,
    a capacitor dielectric layer above said thin conductive layer, and
    an upper plate of said capacitor above said capacitor dielectric layer.

3. A device in accordance with claim 1 including:
    said capacitor comprising:
        a thin conductive layer of doped polysilicon on the surface of said plugs having been polished by CMP,
        a capacitor dielectric layer composed of $Ta_2O_5/TiN$ above said thin conductive layer, and
        an upper plate of said capacitor composed of doped polysilicon above said capacitor dielectric layer.

4. A device in accordance with claim 1 including:
    a dielectric layer over said bit-lines of a silicon nitride layer to seal said bit-lines, and
    a planarized, second interpolysilicon layer formed above said bit-lines.

5. A device in accordance with claim 1 including:
    a dielectric layer over said bit-lines of a silicon nitride layer sealing said bit-lines,
    a planarized, second interpolysilicon layer formed above said bit-lines, and
    said capacitor comprising a thin conductive layer on the surface of said plugs, a capacitor dielectric layer above said thin conductive layer, and an upper plate of said capacitor above said capacitor dielectric layer.

6. A device with bit lines and a capacitor for a semiconductor memory device comprising:
    a gate oxide layer on a doped silicon semiconductor substrate,
    gate electrode/word-line stacks juxtaposed with doped polysilicon plugs over said gate oxide layer, said doped polysilicon plugs being separated by a first dielectric material in a direction oriented transversely of said gate electrode/word-line stacks,
    a first interpolysilicon layer above said doped polysilicon plugs,
    bit-lines in said first interpolysilicon layer above said first dielectric material, and
    capacitors above said plugs and between said bit-lines.

7. A device in accordance with claim 6 including:
    said capacitor comprising:
        a thin conductive layer on the surface of said plugs,
        a capacitor dielectric layer above said thin conductive layer, and
        an upper plate of said capacitor above said capacitor dielectric layer.

8. A device in accordance with claim 6 including:
    said capacitor comprising:
        a thin conductive layer of doped polysilicon on the surface of said polysilicon plugs having been polished by CMP,
        a capacitor dielectric layer composed of $Ta_2O_5/TiN$ above said thin conductive layer, and
        an upper plate of said capacitor composed of doped polysilicon above said capacitor dielectric layer.

9. A device in accordance with claim 6 including:
    a dielectric layer over said bit-lines of a silicon nitride layer to seal said bit-lines,
    a second interpolysilicon layer formed above said bit-lines, and
    said second interpolysilicon layer having been planarized by chemical mechanical polishing.

10. A device in accordance with claim 6 including:
    a dielectric layer over said bit-lines of a silicon nitride layer sealing said bit-lines,
    a second interpolysilicon layer formed above said bit lines,
    said second interpolysilicon layer having been planarized by chemical mechanical polishing, and
    said capacitor comprising a thin conductive layer on the surface of said plugs a capacitor dielectric layer above said thin conductive layer and an upper plate of said capacitor above said capacitor dielectric layer.

* * * * *